(12) United States Patent
Joachimsmeyer et al.

(10) Patent No.: US 9,774,280 B2
(45) Date of Patent: Sep. 26, 2017

(54) MONITORING DEVICE FOR AN ELECTRIC MACHINE, CONTROL DEVICE AND METHOD

(71) Applicant: Brose Fahrzeugteile GmbH & Co. Kommanditgesellschaft, Wurzburg, Wurzburg (DE)

(72) Inventors: Dirk Joachimsmeyer, Hausen (DE); Maxim Kronewald, Hochberg (DE)

(73) Assignee: BROSE FAHRZEUGTEILE GMBH & CO. KOMMANDITGESELLSCHAFT, WUERZBURG, Wuerzburg (DE)

( * ) Notice: Subject to any disclaimer, the term of this patent is extended or adjusted under 35 U.S.C. 154(b) by 0 days.

(21) Appl. No.: 14/854,374

(22) Filed: Sep. 15, 2015

(65) Prior Publication Data
US 2016/0079891 A1    Mar. 17, 2016

(30) Foreign Application Priority Data
Sep. 16, 2014    (DE) .................. 10 2014 218 583

(51) Int. Cl.
*H02P 23/00*    (2016.01)
*H02P 6/12*    (2006.01)
(Continued)

(52) U.S. Cl.
CPC .............. *H02P 6/12* (2013.01); *G01R 31/343* (2013.01); *H02P 29/024* (2013.01); *H02P 23/02* (2013.01)

(58) Field of Classification Search
USPC ...... 318/490, 650; 700/293, 297; 702/44, 60
See application file for complete search history.

(56) References Cited

U.S. PATENT DOCUMENTS 5,279,547 A * 1/1994 Costin ................ A61M 1/0031
604/22
6,315,081 B1 11/2001 Yeo
(Continued)

FOREIGN PATENT DOCUMENTS

CN    1200868 C    5/2005
CN    101383583 A    3/2009
(Continued)

OTHER PUBLICATIONS

EP Search Report from European Application No. 15182550.2, dated Apr. 4, 2016.
(Continued)

*Primary Examiner* — Jorge L Carrasquillo

(57) ABSTRACT

The present invention discloses a monitoring device for an electric machine, comprising a first detection apparatus which is configured to detect electrical power supplied to the electric machine, comprising a second detection apparatus which is configured to detect theoretical mechanical power output by the electric machine on the basis of a commutation of the electric machine, and comprising a calculation apparatus which, on the basis of the detected electrical power and of the detected theoretical mechanical power, is configured to calculate an efficiency of the electric machine and to emit an error signal if the calculated efficiency is greater than 1. The present invention further discloses a control device for an electric machine and a method for monitoring an electric machine.

18 Claims, 4 Drawing Sheets

(51) Int. Cl.
*G01R 31/34* (2006.01)
*H02P 29/024* (2016.01)
*H02P 23/02* (2006.01)

(56) References Cited

U.S. PATENT DOCUMENTS

| | | | |
|---|---|---|---|
| 6,393,373 B1 * | 5/2002 | Duyar | G01R 31/343 |
| | | | 318/490 |
| 6,426,633 B1 * | 7/2002 | Thybo | H02P 6/16 |
| | | | 324/511 |
| 6,501,629 B1 * | 12/2002 | Marriott | H02H 7/08 |
| | | | 361/22 |
| 7,042,180 B2 | 5/2006 | Terry et al. | |
| 8,245,545 B2 | 8/2012 | Maekawa | |
| 8,294,410 B2 | 10/2012 | Ams | |
| 2007/0090713 A1 | 4/2007 | Arita et al. | |
| 2010/0182809 A1 * | 7/2010 | Cullinane | H02P 9/02 |
| | | | 363/34 |
| 2011/0074322 A1 | 3/2011 | Hsu | |
| 2012/0075893 A1 * | 3/2012 | Higuchi | H02M 1/32 |
| | | | 363/37 |
| 2014/0354199 A1 * | 12/2014 | Zeng | H02P 21/0085 |
| | | | 318/400.3 |
| 2015/0168495 A1 * | 6/2015 | Bickel | G01R 31/34 |
| | | | 702/60 |

FOREIGN PATENT DOCUMENTS

| | | |
|---|---|---|
| DE | 10202111 A1 * | 7/2003 |
| DE | 10 2009 048 944 | 4/2011 |
| WO | WO 2013/184143 | 12/2013 |

OTHER PUBLICATIONS

First Office Action from Chinese Patent Application 201510597091.6, dated Jun. 28, 2017, pp. 13.

* cited by examiner

MONITORING DEVICE FOR AN ELECTRIC MACHINE, CONTROL DEVICE AND METHOD

CROSS-REFERENCE TO RELATED APPLICATION

This Application is a non-provisional Application of German Patent Application No. 10 2014 218 583.1, filed Sep. 16, 2014, in German, the contents of which are hereby incorporated by reference in their entirety.

The present invention relates to a monitoring device for an electric machine, to a control device for an electric machine and to a method for monitoring an electric machine.

TECHNICAL BACKGROUND

Nowadays, electric machines have many different uses. The use of brushless electric machines is advantageous in particular in applications in which a high level of availability and a long service life of the electric machines are important, since in these machines the brushes are not subject to any wear.

For example, such electric machines can be used in vehicles as fan motors, in order to provide air conditioning of the vehicle, for example.

Owing to faults in the electric machine or to external influences, during operation of an electric machine the rotor of the electric machine may become blocked. Such a blockage has to be detected by the actuating electronics and the power supply to the electric machine has to be interrupted in order to prevent permanent damage to the power electronics or to the electric machine.

Nowadays, there are various options for detecting a blockage of the rotor of an electric machine. In this case, it is preferable for a blockage to be detected without an additional position sensor, since this increases the system complexity and the costs.

A blockage can for example be detected on the basis of a speed of a Kalman filter used in the control of the electric machine; however, this detection is very imprecise and may therefore lead to a blockage of the rotor of an electric machine not being detected.

Alternatively, model-based methods can be used to detect a blockage of the rotor of the electric machine; however, these methods only function reliably in the upper speed range of the electric machine, since in the lower speed range of the electric machine the measurable back EMF is very low.

DISCLOSURE OF THE INVENTION

The problem addressed by the present invention is therefore to provide a simple option for detecting a rotor blocking in an electric machine.

Accordingly, the present invention discloses a monitoring device according to claim 1, a control device according to claim 8 and a method according to claim 11.

Accordingly, the following is provided:

A monitoring device for an electric machine, comprising a first detection apparatus which is configured to detect electrical power supplied to the electric machine, comprising a second detection apparatus which is configured to detect theoretical mechanical power output by the electric machine on the basis of a commutation of the electric machine, and comprising a calculation apparatus which, on the basis of the detected electrical power and of the detected theoretical mechanical power, is configured to calculate an efficiency of the electric machine and to emit an error signal if the calculated efficiency is greater than 1.

Furthermore, the following is provided:

A control device for an electric machine, comprising actuating electronics which are configured to actuate the electric machine on the basis of a predetermined speed, and comprising a monitoring device according to the invention, wherein the actuating electronics are configured to disconnect the voltage and/or current from the electric machine if the monitoring device emits an error signal.

Lastly, the following is provided:

A method for monitoring an electric machine, comprising detecting electrical power which is supplied to the electric machine, detecting theoretical mechanical power output by the electric machine on the basis of a commutation of the electric machine, calculating an efficiency of the electric machine on the basis of the detected electrical power and of the detected theoretical mechanical power, and emitting an error signal if the calculated efficiency is greater than 1.

Advantages of the Invention

The knowledge underlying the present invention consists in that, for a blocked rotor of an electric machine, the values for electrical power and theoretical mechanical power of the electric machine differ from each other.

Here, theoretical mechanical power means the mechanical power which results from a theoretical calculation of the mechanical power at least on the basis of a speed, or of a speed which is predetermined by commutation of the electric machine.

The concept underlying the present invention consists in taking this knowledge into account and providing an option, on the basis of the difference between electrical power and theoretical mechanical power of the electric machine, for detecting a blockage of the rotor of the electric machine.

For this purpose, the present invention provides a monitoring device in which the electrical power supplied to the electric machine is detected using a first detection apparatus and theoretical mechanical power output by the electric machine is detected using a second detection apparatus.

According to the invention, a calculation apparatus calculates the efficiency of the electric machine from the electrical power and the theoretical mechanical power and emits an error signal when this is greater than 1.

The method according to the invention is intended to be used in particular for brushless electric machines, for example on permanent magnet synchronous motor (PMSM) machines.

The present invention takes advantage of the fact that the motor electronics which actuate the electric machine continue the commutation of the electric machine even if the rotor of the electric machine is blocked.

As a result, if the rotor of the electric machine is blocked, during calculation of the theoretical mechanical power a higher value comes about than for the electrical power, and this leads to the calculated efficiency being greater than 1.

In the control device according to the invention, the monitoring device is coupled to actuating electronics, which disconnect the voltage and/or current from the electric machine on the basis of the error signal, that is to say said electronics terminate the actuation of the electric machine.

Advantageous embodiments and developments are found in the dependent claims and in the description of the drawings.

In one embodiment, the first detection apparatus is configured to calculate the electrical power supplied to the electric machine on the basis of an electrical voltage supplied to the electric machine and of an electric current supplied to the electric machine. This makes it possible to calculate the electrical power supplied to the electric machine in a very simple manner.

In one embodiment, the first detection apparatus comprises a voltage sensor for detecting the electrical voltage supplied to the electric machine. Therefore, the electrical voltage supplied to the electric machine can be measured directly in the detection apparatus.

In one embodiment, the first detection apparatus comprises a current sensor for detecting the electric current supplied to the electric machine. Therefore, the electric current supplied to the electric machine can be measured directly in the detection apparatus.

In one embodiment, the first detection apparatus comprises a measured data interface and is configured to detect the electrical voltage supplied to the electric machine and/or the electric current supplied to the electric machine by means of the measured data interface. As a result, the values which are already available in the actuating electronics of the control device for the electrical voltage supplied to the electric machine and the electric current supplied to the electric machine can for example be reused and do not have to be detected separately.

In one embodiment, the second detection apparatus is configured to calculate the theoretical mechanical power output by the electric machine on the basis of a torque of the electric machine and of a speed of the electric machine which is predetermined by the commutation. This makes it possible to calculate the mechanical power in a very simple and efficient manner.

For example, the mechanical power can be calculated on the basis of the following formula:

$$P_{mech}=2*\pi*M*n$$

Here, M stands for the torque and n stands for the speed. The speed is predetermined by the commutation of the electric machine. The torque can, for example, be calculated for actuation of the electric machine without field weakening in accordance with the following formula:

$$m = \frac{3}{2} * \text{number of pole pairs} * I_q * \Psi$$

Here, $I_q$ stands for the q-axis current in the rotor-fixed coordinate system and $\Psi$ stands for the magnetic flux.

In one embodiment, the calculation apparatus is configured to calculate the efficiency over a predetermined time period and to emit the error signal if the efficiency is greater than 1 over the entire time period. As a result, the electric machine can be prevented from being switched off if the blockage is only brief or if an error occurs in the calculations due to malfunctions.

In one embodiment, the actuating electronics comprise at least one voltage sensor for detecting an electrical voltage provided to the electric machine and are configured to provide the monitoring device with a value which characterises the detected electrical voltage. As a result, the voltage sensor which is already present in the actuating electronics can also be used for the monitoring device.

In one embodiment, the actuating electronics comprise at least one current sensor for detecting an electric current provided to the electric machine and are configured to provide the monitoring device with a value which characterises the detected electric current. As a result, the current sensor which is already present in the actuating electronics can also be used for the monitoring device.

The above embodiments and developments can be combined with one another as desired, provided this is feasible. Further possible embodiments, developments and implementations of the invention also include combinations which are not explicitly stated of features of the invention which are described above or in the following with respect to the embodiments. In particular, a person skilled in the art would also add individual aspects to the respective basic forms of the present invention as improvements or additions.

BRIEF DESCRIPTION OF THE DRAWINGS

The present invention is explained in greater detail in the following on the basis of the embodiments given in the schematic figures of the drawings, in which.

In all the figures, like and functionally like elements and devices have been provided with the same reference numerals, unless otherwise stated.

EMBODIMENTS OF THE INVENTION

Figure 1:
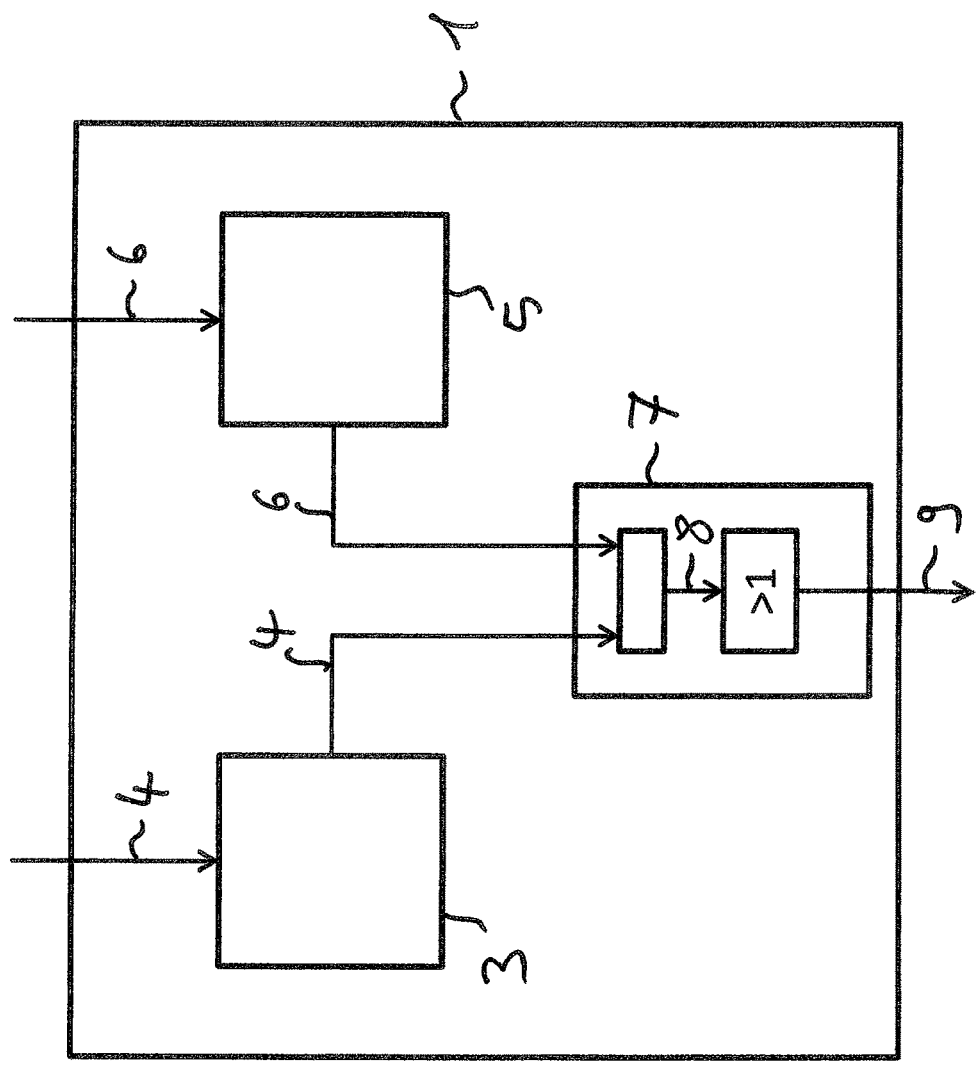
FIG. 1 is a block diagram of an embodiment of the monitoring device according to the invention.

FIG. 1 is a block diagram of an embodiment of the monitoring device 1 according to the invention.

The monitoring device 1 in FIG. 1 comprises a first detection apparatus 3, which detects the electrical power 4 which is supplied to the electric machine 2 (not shown in FIG. 1) to be controlled.

Figure 2:
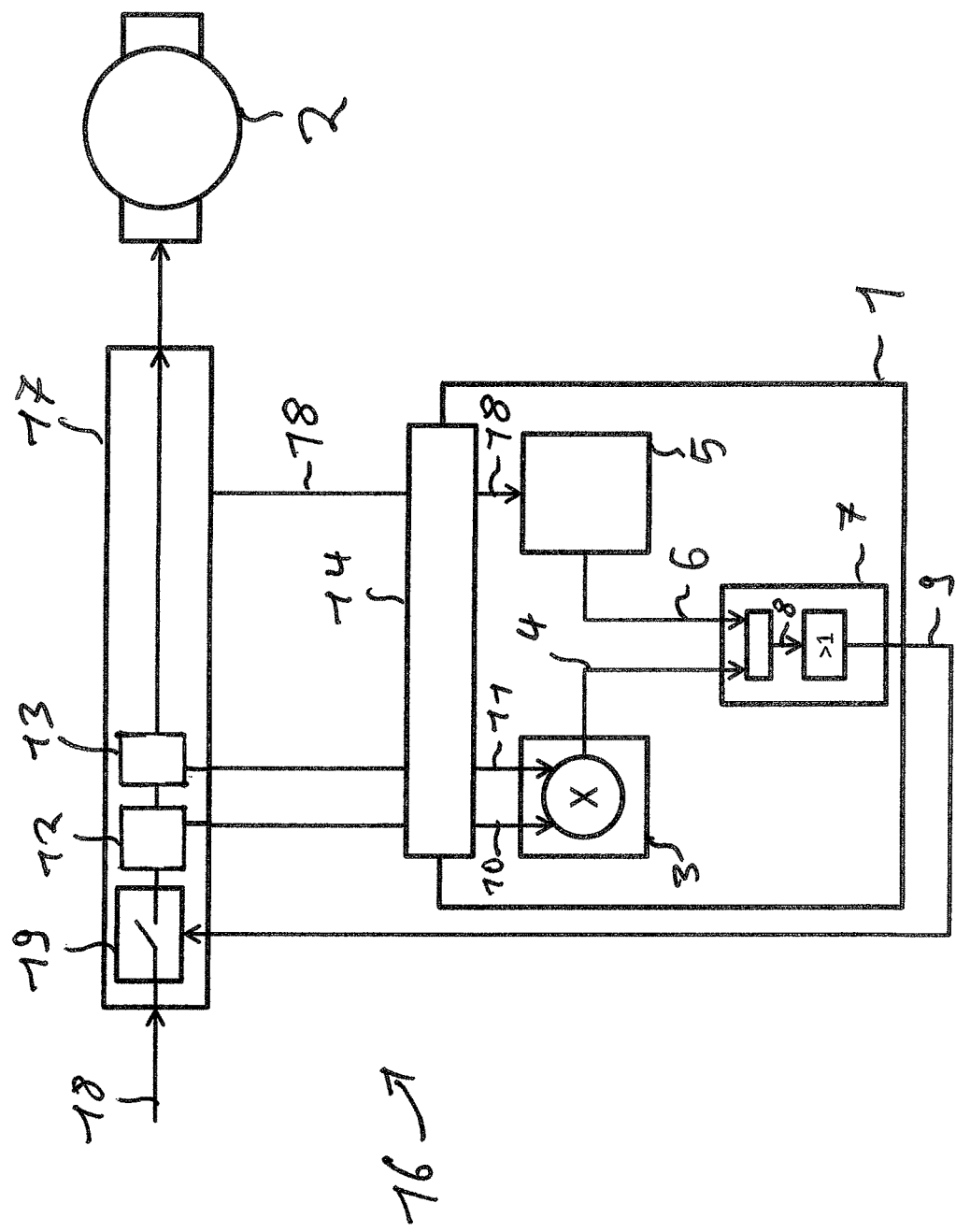
FIG. 2 is a block diagram of an embodiment of the control device according to the invention.

For this purpose, in one embodiment the first detection apparatus 3 can, for example, detect the voltage 10 and the current 11 which is supplied to the electric machine 2. This is shown in FIG. 2.

The monitoring device 1 further comprises a second detection apparatus 5, which detects the mechanical power 6 which is supplied to the electric machine 2. Here, in one embodiment, the second detection apparatus 5 can calculate the mechanical power 6 for example on the basis of the following formula:

$$P_{mech}=2*\pi*M*n$$

Here, M stands for the torque and n stands for the speed 18 which is predetermined by the commutation of the electric machine 2.

The torque M can, in one embodiment, be calculated for example for actuation of the electric machine 2 without field weakening in accordance with the following formula:

$$m = \frac{3}{2} * \text{number of pole pairs} * I_q * \Psi$$

Here, $I_q$ stands for the q-axis current in the rotor-fixed coordinate system and $\Psi$ stands for the magnetic flux.

If the electric machine 2 is operated with field weakening, the torque M results from the following formula:

$$m = \frac{3}{2} * \text{number of pole pairs} * (I_q * \Psi + I_q * I_d * (L_d - L_q))$$

Here, $I_d$ stands for the d-axis current in the rotor-fixed coordinate system and $L_d$ and $L_q$ stand for the respective inductances. The first detection apparatus 3 provides the value for the electrical power 4 of a calculation apparatus 7 of the monitoring device 1. The second detection apparatus 5, however, provides the calculation apparatus 7 with the value for the theoretical mechanical power 6 of the electric machine 2.

The calculation apparatus 7 calculates an efficiency 8 from these two power values 4 and 6. In one embodiment, this can be carried out by dividing the electrical power 4 by the mechanical power 6, for example.

In the event of a fault, that is to say when a rotor of the electric machine 2 is blocked, the second detection apparatus 5 also calculates the mechanical power 6 of the electric machine 2 on the basis of the speed which is predetermined by the commutation of the electric machine 2. Therefore, this results in mechanical power 6 which is greater than that which is actually output by the electric machine 2.

If the efficiency 8 is now calculated from electrical power 4 and mechanical power 6, an efficiency 8 of greater than 1 results from the higher mechanical power 6. However, since this is not physically possible, it can be concluded from this efficiency 8 that the rotor of the electric machine 2 is blocked.

In such a case, the calculation apparatus 7 emits an error signal 9 that can be evaluated by a motor control system of the electric machine 2, for example.

In one embodiment, the monitoring device 1 can be designed as a separate control unit. In such an embodiment, the monitoring device 1 can be coupled to a motor control system of the electric machine 2 for example by means of a bus system, for example a CAN bus.

In another embodiment, the monitoring device 1 can, however, also form part of a control device 16 for an electric machine 2.

For this purpose, the monitoring device 1 can be designed for example as a program module which is executed on a processor of the control device 16. Here, the program module can be executed in parallel with other program modules which are necessary for controlling the electric machine 2.

The monitoring device 1 can, however, also be designed as a separate unit in the control device 16, which unit is coupled to the additional components of the control device 16 by means of separate lines or a bus system. This increases the reliability of the entire system.

If the monitoring device 1 is used in a vehicle and is used for example to monitor fan motors of the air-conditioning system of the vehicle, the monitoring device 1 can be coupled for example to a vehicle bus, for example to a CAN bus or a FlexRay bus and the error signal 9 can for example be transferred to a superordinate vehicle control mechanism which evaluates the error signal 9 and takes appropriate measures. For example, the power of the air-conditioning system can be limited. However, the remaining fan motors can also be actuated with increased power, in order to compensate for the malfunction. For example, it can also be indicated to the driver of the vehicle that the vehicle should be serviced.

FIG. 2 is a block diagram of an embodiment of the control device 16 according to the invention.

The control device 16 in FIG. 2 comprises a monitoring device 1, which is based on the monitoring device 1 in FIG. 1.

By contrast with FIG. 1, the monitoring device 1 in FIG. 2 comprises a measured data interface 14, by means of which the monitoring device 1 detects the voltage 10 supplied to the electric machine 2 and the current 11 supplied to the electric machine 2. Furthermore, by means of the measured data interface 14 the monitoring device 1 also detects the speed 18 which is predetermined by the commutation of the electric machine 2. In one embodiment, the monitoring device 1 can also detect the value of the current Iq and of the magnetic flux $\Psi$ by means of the measured data interface 14.

The control device 16 in FIG. 2 further comprises actuating electronics 17 which obtain a predetermined speed 18 and actuate the electric machine 2 on the basis of this predetermined speed 18.

FIG. 2 does not show elements of the actuating electronics 17 which are known to a person skilled in the art, such as the inverter or the like. For the sake of clarity, only those components of the actuating electronics 17 are shown which are necessary for explaining the function of the present invention.

The actuating electronics 17 comprise a voltage sensor 12 and a current sensor 13, which detect the electrical voltage 10 supplied to the electric machine 2 and the electric current 11 supplied to the electric machine 2 respectively and provide said voltage and current to the monitoring device 1 by means of the measured data interface 14 thereof. The actuating electronics 17 further provide the speed 18 predetermined by the commutation of the electric machine 2 to the monitoring device 1 by means of the measured data interface 14.

As already mentioned above, the first detection apparatus 3 can calculate the electrical power 4, which is supplied to the electric machine 2, from the electrical voltage 10 supplied to the electric machine 2 and the electric current 11 supplied to the electric machine 2. On the basis of the speed 18 and depending on the configuration, the current Iq and the magnetic flux $\Psi$, the second detection apparatus 5 can calculate the theoretical mechanical power 6 output by the electric machine 2.

The error signal 9 which is calculated by the calculation apparatus 7 on the basis of the electrical power 4 and the output theoretical mechanical power 6 is provided to the actuating electronics 17, which comprises an automatic shutoff 19, shown as a switch 19 in FIG. 2. This automatic shutoff 19 disconnects the current and/or voltage from the electric machine 2 when the error signal 9 is present.

Figure 3:
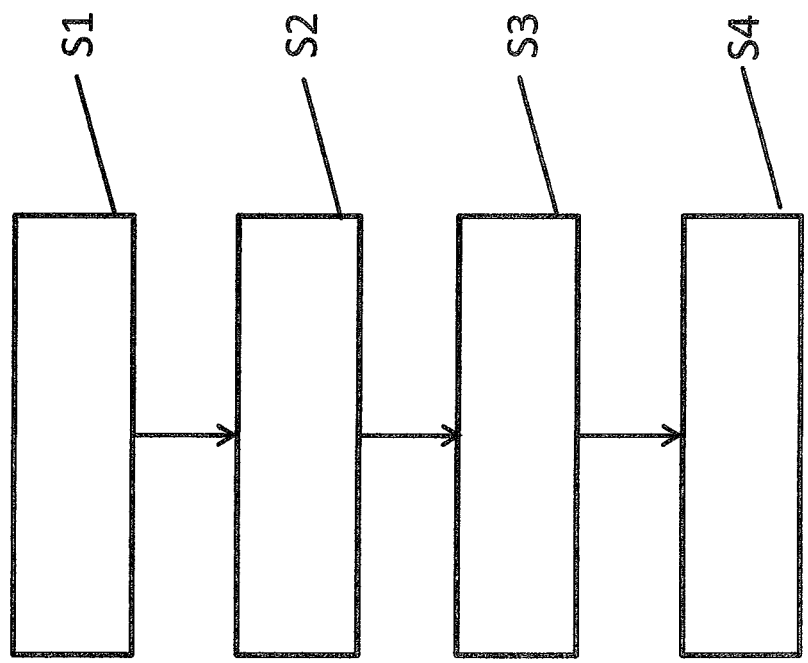
FIG. 3 is a flow diagram of an embodiment of the method according to the invention.

FIG. 3 is a flow diagram of an embodiment of the method according to the invention.

The method for monitoring an electric machine 2 comprises detecting S1 electrical power 4 supplied to the electric machine 2. Furthermore, the method comprises detecting S2 theoretical mechanical power 6 output by the electric machine 2 on the basis of a commutation of the electric machine 2. An efficiency 8 of the electric machine 2 is calculated S3 from the detected electrical power 4 and the detected theoretical mechanical power 6.

Lastly, an error signal 9 is emitted S4 if the calculated efficiency 8 is greater than 1.

In one embodiment of the method, the electrical power 4 supplied to the electric machine 2 can be calculated on the basis of an electrical voltage 10 supplied to the electric machine 2 and an electric current 11 supplied to the electric machine 2. For example, the two values can simply be multiplied to calculate the electrical power 4.

The electrical voltage 10 supplied to the electric machine 2 can, in one embodiment, be directly detected by a voltage sensor 12. Additionally or alternatively, the electric current 11 supplied to the electric machine 2 can, in one embodiment, be detected by a current sensor 13.

In one embodiment, the electrical voltage 10 supplied to the electric machine 2 and/or the electric current 11 supplied to the electric machine 2 can be provided by control apparatuses which are not used for carrying out the method and can be detected for example by means of a measured data interface 14.

The theoretical mechanical power 6 output by the electric machine 2 can, in one embodiment, be calculated on the basis of a torque of the electric machine 2 and of a speed 18 of the electric machine 2 predetermined by the commutation. The formulae for calculating the mechanical power 6 have already been explained in conjunction with FIG. 1.

Lastly, in one embodiment the efficiency 8 can be calculated over a predetermined time period 15 and the error signal 9 can be emitted if the efficiency 8 is greater than 1 over the entire time period.

The method according to the invention can for example be configured as a program product and can be executed in a vehicle control mechanism of a vehicle. Here, the vehicle control mechanism may be a motor control mechanism which also controls the electric machine 2.

Figure 4:
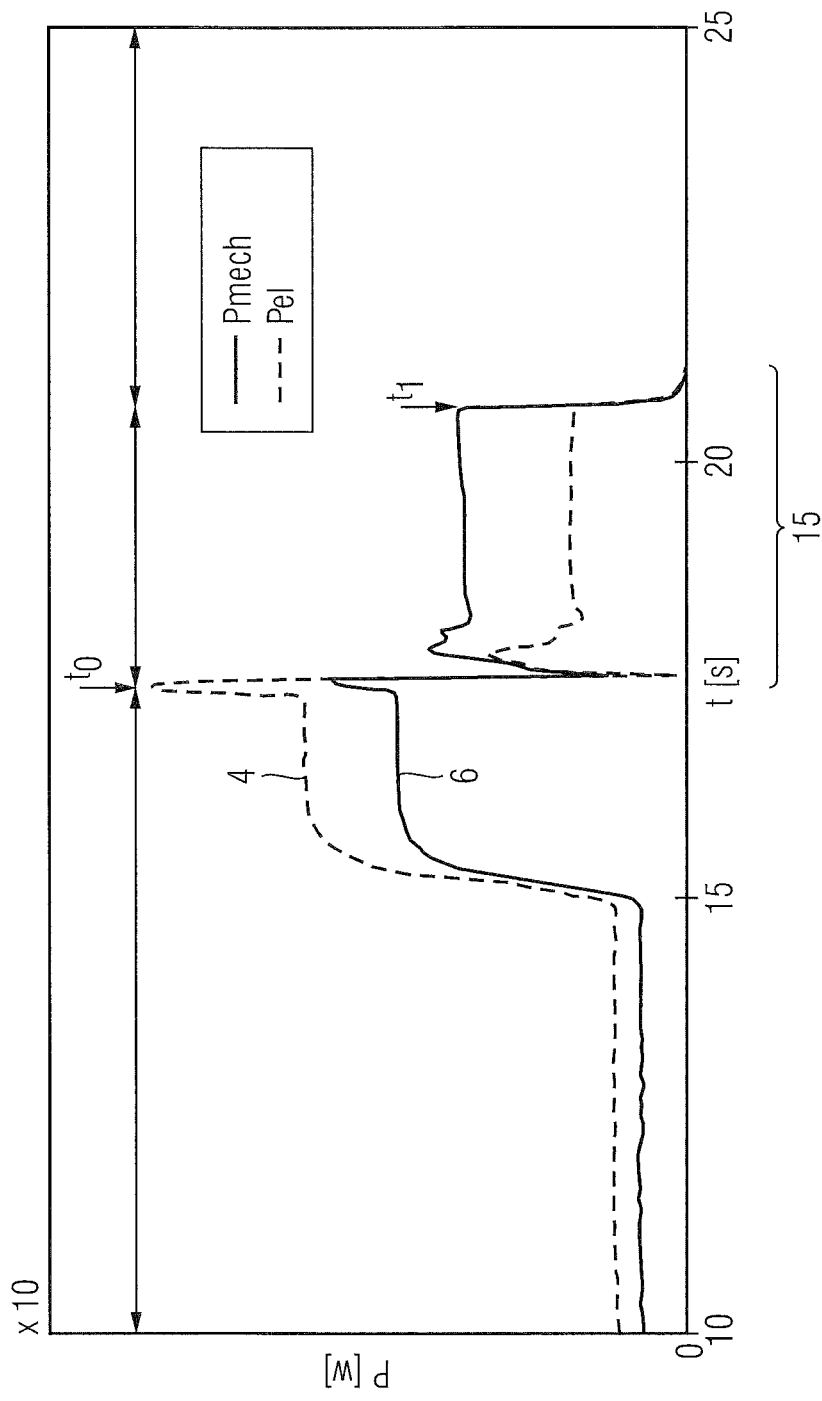
FIG. 4 is a graph showing the progression of mechanical power and the progression of electrical power of an electric machine.

FIG. 4 is a graph showing the progression of mechanical power 6 (continuous line) and the progression of electrical power 4 (dashed line) of an electric machine 2.

The y-axis of the graph shows the power in watts and the x-axis of the graph shows the time in seconds from 10 seconds to 25 seconds.

The progressions shown in the graph in FIG. 4 are only given by way of example and may differ from the progressions shown for different electric machines 2 and different embodiments of the present invention.

The curve for the electrical power 4 extends as far as a point in time of 15 seconds at approximately 150 W. Approximately in parallel with this curve, the curve for the mechanical power 6 extends at approximately 120 W. Between 15 seconds and the point in time t0 at approximately 17.5 seconds, the electrical power 4 increases and the mechanical power 6 follows the increase in the electrical power, a strong increase in the electrical and mechanical power 4, 6 being observed shortly before reaching the point in time t0. At the point in time t0, the rotor of the electric machine 2 is blocked. At the point in time t0, both the electrical power 4 and the mechanical power 6 decrease to 0 W.

Immediately afterwards, the electrical power 4 increases to approximately 41 W and the mechanical power 6 increases to approximately 85 W. Until the point in time t1, at approximately 22 seconds, the electrical power 4 and the mechanical power 6 proceed approximately constantly.

It should be noted that the mechanical power 6 adopts a higher value than the electrical power 4. As already explained, the speed which would be set by the commutation of the electric machine 2 for a rotor which is not blocked is used for calculating the mechanical power 6. As long as the commutation of the electric machine 2 continues, the greater mechanical power 6 can be used as an indication of a blocked rotor.

The difference between the point in time t0 and the point in time t1 corresponds to a predetermined time period 15, which is used as a time-out or safety buffer for detecting a blocked rotor of the electric machine 2.

From the point in time t1, both the electrical power 4 and the mechanical power 6 decrease to 0, since the actuating electronics 17 terminate the commutation of the electric machine 2 at this point in time.

Although the present invention has been described above on the basis of preferred embodiments, it is not restricted thereto, but rather can be modified in many ways. In particular, the invention can be altered or modified in various ways without departing from the core of the invention.

LIST OF REFERENCE SIGNS 1 monitoring device
2 electric machine
3 first detection apparatus
4 electrical power
5 second detection apparatus
6 theoretical mechanical power
7 calculation apparatus
8 efficiency
9 error signal
10 electrical voltage
11 electric current
12 voltage sensor
13 current sensor
14 measured data interface
15 predetermined time period
16 control device
17 actuating electronics
18 predetermined speed
19 switch
t0, t1 points in time
S1-S4 method steps

The invention claimed is:

1. A monitoring device for detecting a blocking of a rotor of an electric machine comprising:
   a first detection apparatus which is configured to detect electrical power supplied to the electric machine,
   a second detection apparatus which is configured to calculate a theoretical mechanical power output by the electric machine on the basis of a predetermined commutation of the electric machine, wherein the theoretical mechanical power output denotes mechanical power which results from a theoretical calculation of a speed which is predetermined by commutation of the electric machine,
   a calculation apparatus which, on the basis of the detected electrical power and of the calculated theoretical mechanical power output, is configured to calculate an efficiency of the electric machine and to detect a blocking of the electric machine if values for the detected electrical power and the calculated theoretical mechanical power output differ from each other.

2. The device of claim 1, wherein the first detection apparatus is configured to calculate the electrical power supplied to the electric machine on the basis of an electrical voltage supplied to the electric machine and of an electric current supplied to the electric machine.

3. The device of claim 2, wherein the first detection apparatus comprises a voltage sensor for detecting the electrical voltage supplied to the electric machine.

4. The device of claim 1, wherein the first detection apparatus comprises a current sensor for detecting the electric current supplied to the electric machine.

5. The device of claim 2, wherein the first detection apparatus comprises a measured data interface and is configured to detect the electrical voltage supplied to the electric machine and/or the electric current supplied to the electric machine by means of the measured data interface.

6. The device of claim 1, wherein the second detection apparatus is configured to calculate the theoretical mechanical power output by the electric machine on the basis of a torque of the electric machine and of the speed of the electric machine which is predetermined by the commutation.

7. The device of claim 1, wherein the calculation apparatus is configured to calculate the efficiency over a predetermined time period and to emit an error signal if the efficiency is greater than 1 over the entire time period.

8. A control device for an electric machine, comprising:
actuating electronics configured to actuate the electric machine on the basis of a predetermined speed; and
comprising a monitoring device according to claim 7;
wherein the actuating electronics are configured to disconnect the voltage and/or current from the electric machine if the monitoring device emits an error signal.

9. The device of claim 8, wherein the actuating electronics comprise at least one voltage sensor for detecting an electrical voltage provided to the electric machine and are configured to provide the monitoring device with a value which characterizes the detected electrical voltage.

10. The device of claim 8, wherein the actuating electronics comprise at least one current sensor for detecting an electric current provided to the electric machine and are configured to provide the monitoring device with a value which characterizes the detected electric current.

11. A method for detecting a blocking of a rotor of an electric machine, comprising:
detecting electrical power which is supplied to the electric machine;
calculating a theoretical mechanical power output by the electric machine on the basis of a predetermined commutation of the electric machine, wherein the theoretical mechanical power output denotes mechanical power which results from a theoretical calculation of a speed which is predetermined by commutation of the electric machine;
calculating an efficiency of the electric machine on the basis of the detected electrical power and the calculated theoretical mechanical power output; and
detecting a blocking of the electric machine if values for the detected electrical power and the calculated theoretical mechanical power output differ from each other.

12. The method of claim 11, further comprising calculating the electrical power supplied to the electric machine on the basis of an electrical voltage supplied to the electric machine and of an electric current supplied to the electric machine.

13. The method of claim 12, wherein calculating the electrical power comprises detecting the electrical voltage supplied to the electric machine by a voltage sensor.

14. The method of claim 12, wherein calculating the electrical power comprises detecting the electric current supplied to the electric machine by a current sensor.

15. The method of claim 12, wherein calculating the electrical power comprises detecting the electrical voltage supplied to the electric machine using a measured data interface.

16. The method of claim 12, wherein calculating the electrical power comprises detecting the electric current supplied to the electric machine using a measured data interface.

17. The method of claim 11, wherein calculating the theoretical mechanical power output includes calculating the theoretical power output on the basis of a torque of the electric machine and of the speed of the electric machine which is predetermined by the commutation.

18. The method of claim 11, wherein:
calculating the efficiency comprises calculating the efficiency over a predetermined time period; and
the method includes emitting an error signal if the efficiency is greater than 1 over the entire time period.

* * * * *